United States Patent
Shiraishi

(10) Patent No.: US 12,230,353 B2
(45) Date of Patent: Feb. 18, 2025

(54) BRIDGE CHIP, SEMICONDUCTOR STORAGE DEVICE, AND MEMORY SYSTEM

(71) Applicant: Kioxia Corporation, Tokyo (JP)

(72) Inventor: Mikio Shiraishi, Yokohama Kanagawa (JP)

(73) Assignee: KIOXIA CORPORATION

( * ) Notice: Subject to any disclaimer, the term of this patent is extended or adjusted under 35 U.S.C. 154(b) by 165 days.

(21) Appl. No.: 18/177,955

(22) Filed: Mar. 3, 2023

(65) Prior Publication Data

US 2023/0420004 A1 Dec. 28, 2023

(30) Foreign Application Priority Data

Jun. 22, 2022 (JP) ................. 2022-100525

(51) Int. Cl.
*G11C 7/00* (2006.01)
*G11C 7/10* (2006.01)
*G11C 7/22* (2006.01)
*G11C 16/10* (2006.01)
*G11C 16/32* (2006.01)
*H10B 80/00* (2023.01)

(52) U.S. Cl.
CPC ............... *G11C 7/10* (2013.01); *G11C 7/22* (2013.01); *G11C 16/10* (2013.01); *G11C 16/32* (2013.01); *H10B 80/00* (2023.02)

(58) Field of Classification Search
CPC ..... G11C 16/10; G11C 16/0483; G11C 16/26; G11C 11/5628; G11C 16/16
USPC .................................... 365/189.12
See application file for complete search history.

(56) References Cited

U.S. PATENT DOCUMENTS

| | | | |
|---|---|---|---|
| 8,112,655 B2 | 2/2012 | Drucker et al. | |
| 8,504,789 B2 | 8/2013 | Pyeon et al. | |
| 11,204,977 B2 | 12/2021 | Maiyuran et al. | |
| 2009/0129155 A1* | 5/2009 | Honda | G11C 16/10 |
| | | | 365/185.09 |

FOREIGN PATENT DOCUMENTS

| | | |
|---|---|---|
| JP | 2008-537265 A | 9/2008 |
| JP | 2012-531635 A | 12/2012 |
| JP | 2021-177366 A | 11/2021 |

* cited by examiner

*Primary Examiner* — Son T Dinh
(74) *Attorney, Agent, or Firm* — Foley & Lardner LLP

(57) ABSTRACT

A bridge chip includes a first selection circuit, a second selection circuit, and a control circuit. The first selection circuit determines an output destination of input data and an input flag indicating whether the input data is valid or invalid based on a first selection signal. The second selection circuit determines an output destination of the input data and the input flag output from the first selection circuit based on a second selection signal. The control circuit generates the first selection signal and the second selection signal, and outputs the first selection signal and the second selection signal to the first selection circuit and the second selection circuit, respectively.

20 Claims, 11 Drawing Sheets

BRIDGE CHIP, SEMICONDUCTOR STORAGE DEVICE, AND MEMORY SYSTEM

CROSS-REFERENCE TO RELATED APPLICATION (S)

This application is based upon and claims the benefit of priority from Japanese Patent Application No. 2022-100525, filed Jun. 22, 2022, the entire contents of which are incorporated herein by reference.

FIELD

Embodiments described herein relate generally to a bridge chip, a semiconductor storage device, and a memory system.

BACKGROUND

A semiconductor storage device in which a bridge chip is disposed between a controller and a plurality of memory chips is known. In the semiconductor storage device, access from the controller to the plurality of memory chips is performed through the bridge chip.

The bridge chip includes a separation circuit for separating write data from the controller into data for the number of memory chips to be accessed and transmitting the data to each memory chip. The separation circuit is required to continue the separation operation while keeping the distribution order of data to the memory chips to be accessed.

DETAILED DESCRIPTION

Embodiments provide a bridge chip, a semiconductor storage device, and a memory system capable of controlling a separation operation while keeping a distribution order.

In general, according to one embodiment, a bridge chip includes a first selection circuit, a second selection circuit, and a control circuit. The first selection circuit determines an output destination of input data and an input flag indicating whether the input data is valid or invalid based on a first selection signal. The second selection circuit determines an output destination of the input data and the input flag output from the first selection circuit based on a second selection signal. The control circuit generates the first selection signal and the second selection signal, and outputs the first selection signal and the second selection signal to the first selection circuit and the second selection circuit, respectively.

Hereinafter, embodiments will be described with reference to drawings.

First Embodiment

Figure 1:
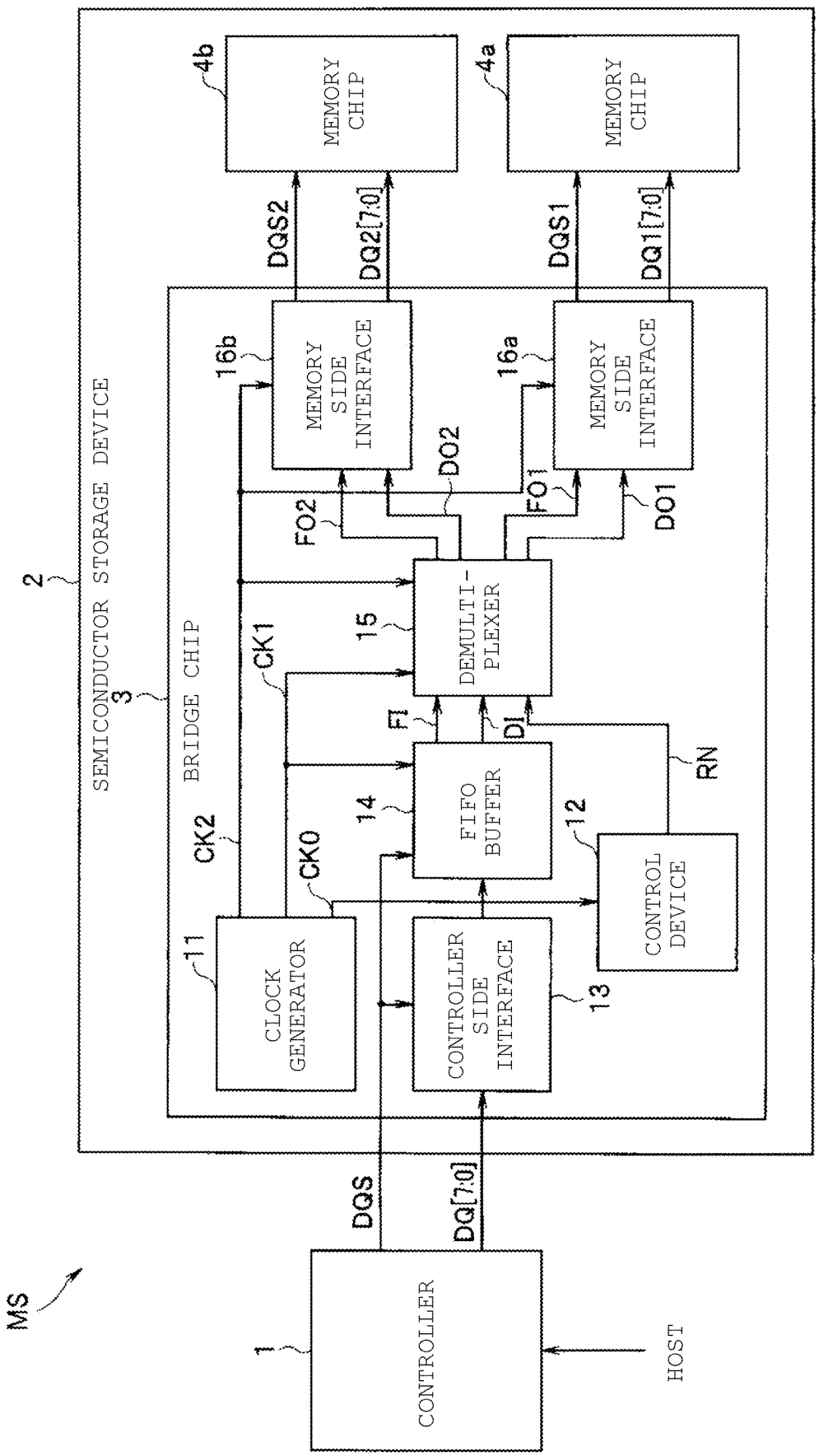
FIG. 1 is a block diagram showing an example of a configuration of a memory system according to a first embodiment.

FIG. 1 is a block diagram showing an example of a configuration of a memory system according to a first embodiment. A memory system MS of at least one embodiment includes a controller 1 and a semiconductor storage device 2. The memory system MS can be connected to a host. The host is, for example, an electronic device such as a personal computer and a portable terminal.

The semiconductor storage device 2 includes a bridge chip 3 and two memory chips 4a and 4b. The bridge chip 3 is disposed between the controller 1 and the two memory chips 4a and 4b. With such a configuration, the data transfer rate between the controller 1 and the memory chips 4a and 4b is improved almost twice as much as that in a configuration in which the controller 1 and the memory chips 4a and 4b are directly connected.

The semiconductor storage device 2 includes two memory chips 4a and 4b, but may have three or more memory chips. The data transfer rate between the controller 1 and three or more memory chips can be enhanced at a rate corresponding to the number of memory chips. Each of the bridge chip 3 and the memory chips 4a and 4b is formed as a semiconductor chip. In the semiconductor storage device 2, the bridge chip 3 and the memory chips 4a and 4b may be provided as different packages, or may be provided as a multi-chip package (MCP) in which the bridge chip 3, the memory chips 4a and 4b are stacked. The memory chips 4a and 4b are memory chips of a nonvolatile memory such as a NAND type flash memory.

The controller 1 controls writing of data to the memory chips 4a and 4b according to a write request from the host. The controller 1 controls reading of data from the memory chips 4a and 4b according to a read request from the host. The configuration of the memory system MS shown in FIG. 1 shows each block related to a write operation and a signal transmitted/received between the blocks among the configurations related to writing of data to the semiconductor storage device 2 using the controller 1.

The bridge chip 3 includes a clock generator 11, a control device 12, a controller side interface 13, a FIFO buffer 14, a demultiplexer 15, and memory side interfaces 16a and 16b.

The clock generator 11 generates a control clock CK0, a first operation clock CK1, and a second operation clock CK2. The second operation clock CK2 is a clock obtained by dividing the first operation clock CK1 by two.

The clock generator 11 outputs the control clock CK0 to the control device 12. The clock generator 11 outputs the first operation clock CK1 to the FIFO buffer 14 and the demultiplexer 15, and outputs the second operation clock CK2 to the demultiplexer 15 and the memory side interfaces 16a and 16b.

The control device 12 controls each block in the bridge chip 3 based on the control clock CK0. The control device 12 generates a reset signal RN and outputs the generated reset signal RN to the demultiplexer 15. The control device 12 performs the reset by setting the reset signal RN to a low level for a certain period, and then releases the reset by raising the reset signal RN to a high level.

The transmission and reception of signals between the controller 1 and the semiconductor storage device 2 is, for example, specified by the Toggle standard. The controller 1 transfers 8-bit data DQ[7:0] to the semiconductor storage device 2 in a double data rate (DDR) format synchronized with both the rising and falling edges of a data strobe signal DQS according to the Toggle standard. The 8-bit data is input to the controller side interface 13. The data strobe signal DQS is input to the controller side interface 13 and the FIFO buffer 14.

The controller side interface 13 converts the 8-bit data DQ [7:0] input in the DDR format into 16-bit signal of a single data rate (SDR) format synchronized only with the rising edge of the data strobe signal DQS and outputs the converted signal to the FIFO buffer 14.

The FIFO buffer 14 receives 16-bit data from the controller side interface 13 in synchronization with the rising edge of the data strobe signal DQS. The FIFO buffer 14 supplies the data received from the controller side interface 13 to the demultiplexer 15 as input data DI in synchronization with the rising edge of the first operation clock CK1 supplied from the clock generator 11. The FIFO buffer 14 generates an input flag FI indicating whether the input data DI to be supplied to the demultiplexer 15 is valid or invalid, and supplies the generated input flag FI to the demultiplexer 15.

The demultiplexer 15 separates the input flag FI and the input data DI into a first output flag FO1, a first output data DO1, a second output flag FO2, and a second output data DO2. The demultiplexer 15 outputs the first output flag FO1 and the first output data DO1 to the memory side interface 16a, and outputs the second output flag FO2 and the second output data DO2 to the memory side interface 16b. Detailed configuration of the demultiplexer 15 is described with reference to FIG. 2 below.

The memory side interface 16a converts the 16-bit first output data DO1 supplied from the demultiplexer 15 into 8-bit data DQ1 [7:0]. The memory side interface 16a controls a stop and a restart of data strobe signal DQS1 based on the value of the first output flag FO1. The memory side interface 16a supplies the data DQ1 [7:0] and a data strobe signal DQS1 to the memory chip 4a in the DDR format in synchronization with the rising and falling edges of the second operation clock CK2.

The memory side interface 16b converts the 16-bit second output data DO2 supplied from the demultiplexer 15 into 8-bit data DQ2 [7:0]. The memory side interface 16b controls a stop and a restart of data strobe signal DQS2 based on the value of the second output flag FO2. The memory side interface 16b supplies the data DQ2 [7:0] and a data strobe signal DQS2 to the memory chip 4b in the DDR format in synchronization with the rising and falling edges of the second operation clock CK2.

Figure 2:
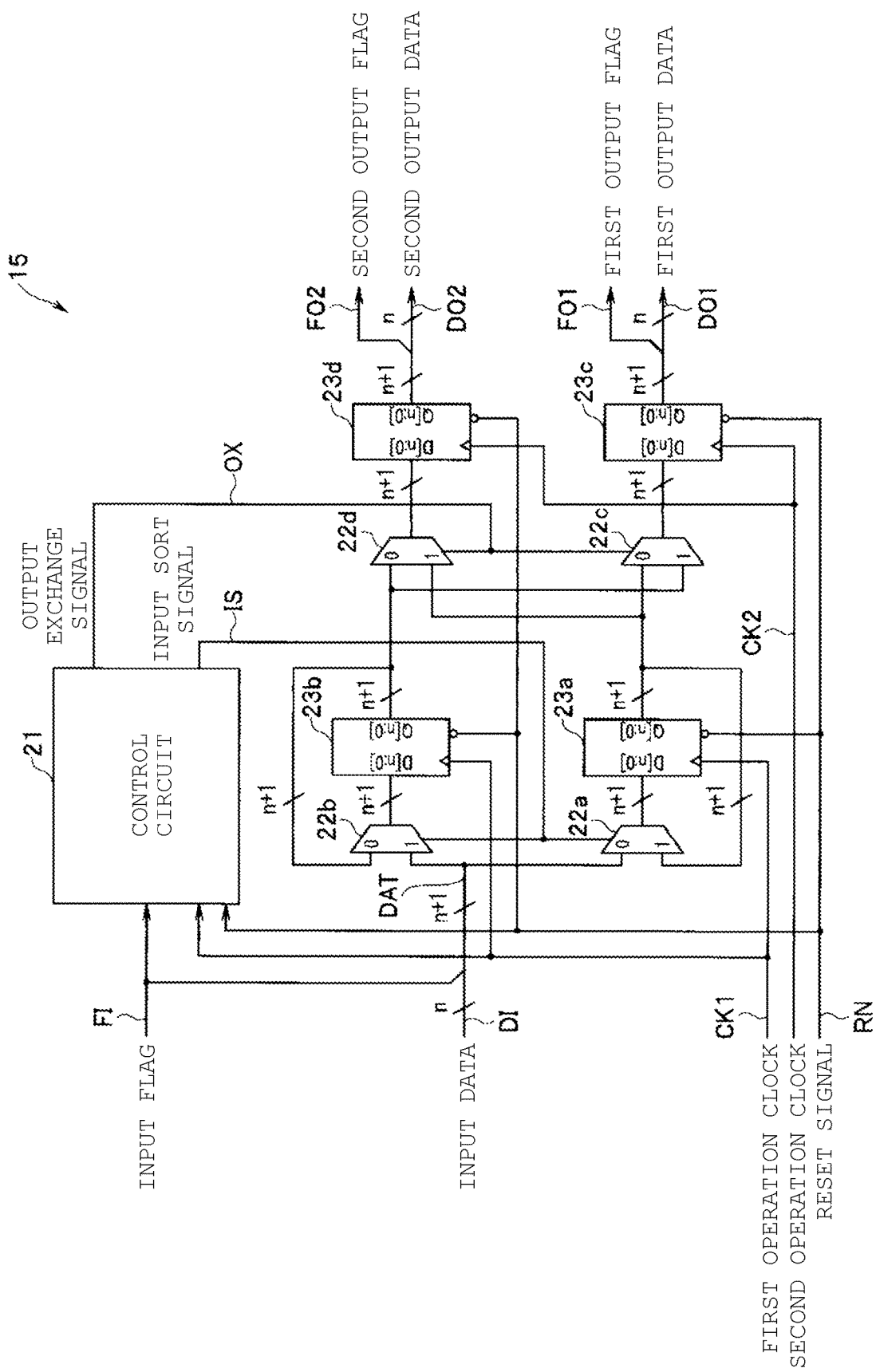
FIG. 2 is a block diagram showing an example of a configuration of a demultiplexer according to the first embodiment.

FIG. 2 is a block diagram showing an example of the configuration of the demultiplexer according to the first embodiment. The demultiplexer 15 includes a control circuit 21, multiplexers 22a, 22b, 22c, and 22d, and registers 23a, 23b, 23c, and 23d as shown in FIG. 2.

The first operation clock CK1 input to the demultiplexer 15 is supplied to the control circuit 21, the registers 23a and 23b. The second operation clock CK2 input to the demultiplexer 15 is supplied to the registers 23c and 23d. The reset signal RN input to the demultiplexer 15 is supplied to the control circuit 21, and the registers 23a, 23b, 23c, and 23d.

The input flag FI is input to the control circuit 21. The input flag FI is added to the most significant bit of the input data DI. That is, the n-bit input data DI is added with the input flag FI as the most significant bit and input to the multiplexers 22a and 22b as (n+1)-bit data DAT.

The control circuit 21 generates an input sort signal IS and an output exchange signal OX based on the input flag FI, the first operation clock CK1, and the reset signal RN. The control circuit 21 outputs the input sort signal IS to the multiplexers 22a and 22b, and outputs the output exchange signal OX to the multiplexers 22c and 22d. Detailed configuration of the control circuit 21 is described with reference to FIGS. 3 and 4 as described below.

The data DAT is input to one input terminal of the multiplexer 22a, and data fed back from the register 23a is input to the other input terminal. The multiplexer 22a selects one piece of the input data and outputs the selected data to the register 23a based on the input sort signal IS supplied to the control terminal.

Specifically, when the input sort signal IS is a low-level signal, the multiplexer 22a selects the data DAT and outputs the data to the register 23a. On the other hand, when the input sort signal IS is at a high level, the multiplexer 22a selects the data fed back from the register 23a and outputs the selected data to the register 23a.

The data fed back from the register 23b is input to one input terminal of the multiplexer 22b, and the data DAT is input to the other input terminal. The multiplexer 22b selects one piece of the input data and outputs the selected data to the register 23b based on the input sort signal IS supplied to the control terminal.

Specifically, when the input sort signal IS is at a low level, the multiplexer 22b selects the data fed back from the register 23b and outputs the selected data to the register 23b. On the other hand, when the input sort signal IS is at a high level, the multiplexer 22b selects the data DAT and outputs the selected data to the register 23b.

Thus, when the input sort signal IS is at a low level, the data DAT is selected by the multiplexer 22a and stored in the register 23a. On the other hand, when the input sort signal IS is at a high level, the data DAT is selected by the multiplexer 22b and stored in the register 23b. That is, the data DAT including the input flag FI and the input data DI is distributed to the registers 23a or 23b based on the input sort signal IS generated by the control circuit 21. Thus, the multiplexers 22a and 22b determine the output destination of the data DAT (input data DI and input flag FI) based on the input sort signal IS (a first selection signal). The multiplexers 22a and 22b are an example of the first selection circuit.

The register 23a stores (n+1)-bit data output from the multiplexer 22a in synchronization with the rising edge of the first operation clock CK1. The data stored in the register 23a is input to the multiplexers 22c and 22d. The data stored in the register 23a is fed back to the other input terminal of the multiplexer 22a.

The register 23b stores (n+1)-bit data output from the multiplexer 22b in synchronization with the rising edge of the first operation clock CK1. The data stored in the register 23b is input to the multiplexers 22c and 22d. The data stored in the register 23b is fed back to one input terminal of the multiplexer 22b. Thus, the registers 23a and 23b fetch the outputs of the multiplexers 22a and 22b in synchronization with the rising edge of the first operation clock CK1. The registers 23a and 23b are an example of a first register.

The output of the register 23a is input to one input terminal of the multiplexer 22c, and the output of the register 23b is input to the other input terminal. The multiplexer 22c selects data input from either of the registers 23a and 23b based on the output exchange signal OX supplied to the control terminal and outputs the data to the register 23c. Specifically, when the output exchange signal OX is a low-level signal, the multiplexer 22c selects the data output from the register 23a and outputs the selected data to the register 23c. On the other hand, when the output exchange signal OX is at a high level, the multiplexer 22c selects the data output from the register 23b and outputs the selected data to the register 23c.

The output of the register 23b is input to one input terminal of the multiplexer 22d, and the output of the register 23a is input to the other input terminal. The multiplexer 22d selects data input from either of the registers 23a and 23b based on the output exchange signal OX supplied to the control terminal and outputs the data to the register 23d. Specifically, when the output exchange signal OX is a low-level signal, the multiplexer 22d selects the input data output from the register 23b and outputs the selected data to the register 23d. On the other hand, when the output exchange signal OX is at a high level, the multiplexer 22d selects the data output from the register 23a and outputs the selected data to the register 23d. Thus, the multiplexers 22c and 22d selectively exchange an output destination of the (n+1)-bit data input from the registers 23a and 23b based on the output exchange signal OX (a second selection signal). The multiplexers 22c and 22d are an example of a second selection circuit.

Therefore, when the output exchange signal OX is at a low level, the output of the register 23a is input to the register 23c, and the output of the register 23b is input to the register 23d. On the other hand, when the output exchange signal OX is at a high level, the output of the register 23a is input to the register 23d, and the output of the register 23b is input to the register 23c. That is, the outputs of the registers 23a and 23b is exchanged and input to the registers 23c and 23d.

The register 23c stores (n+1)-bit data output from the multiplexer 22c in synchronization with the rising edge of the second operation clock CK2. After the data stored in the register 23c is output from the register 23c, the data is separated into n-bit first output data DO1 and a 1-bit first output flag FO1, and supplied to the memory side interface 16a.

The register 23d stores (n+1)-bit data output from the multiplexer 22d in synchronization with the rising edge of the second operation clock CK2. After the data stored in the register 23d is output from the register 23d, the data is separated into n-bit second output data DO2 and a 1-bit second output flag FO2, and supplied to the memory side interface 16b. Thus, the registers 23c and 23d fetch the outputs of the multiplexers 22c and 22d in synchronization with the rising edge of the second operation clock CK2. The registers 23c and 23d are an example of a second register.

Figure 3:
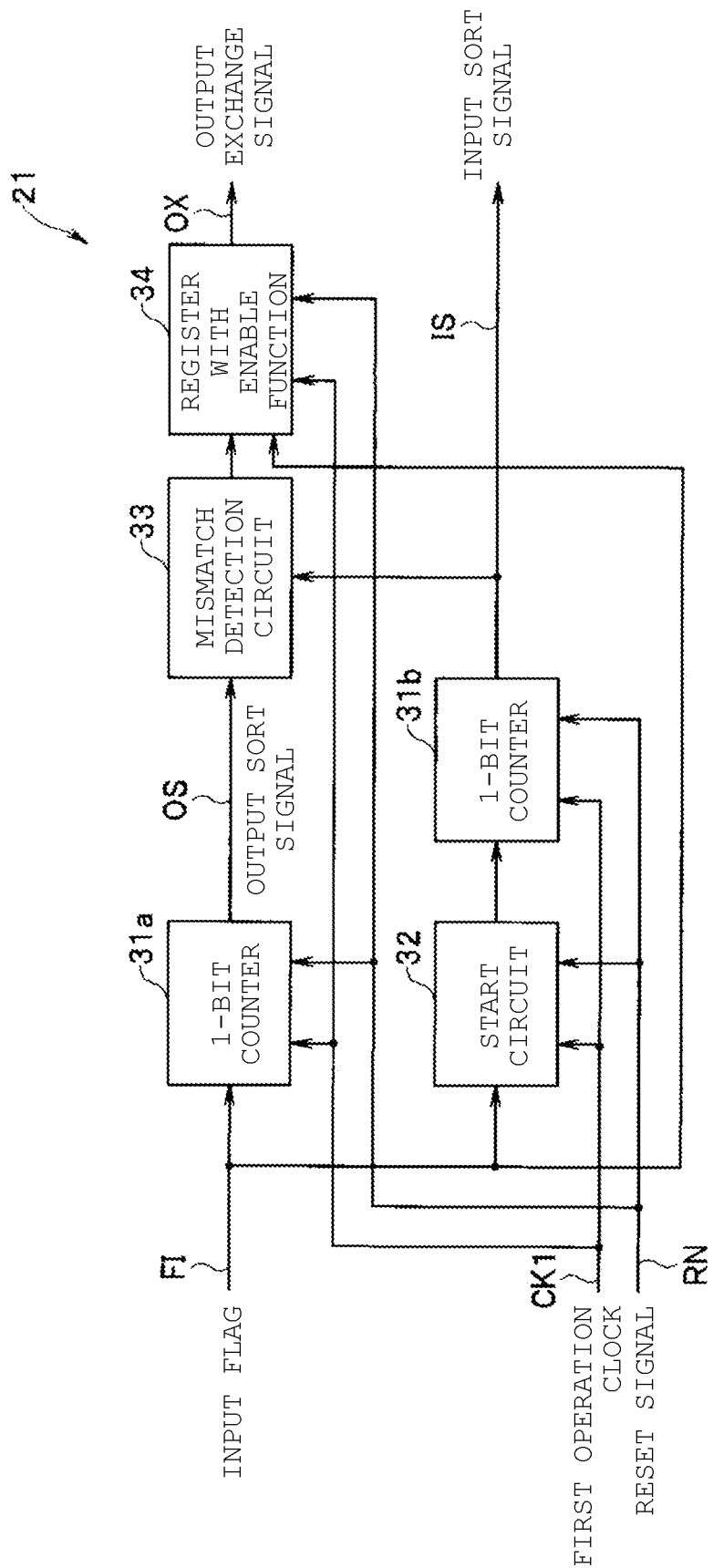
FIG. 3 is a block diagram showing an example of a configuration of a control circuit according first embodiment.

FIG. 3 is a block diagram showing an example of the configuration of the control circuit according to the first embodiment. The control circuit 21 includes 1-bit counters 31a and 31b, a start circuit 32, a mismatch detection circuit 33, and a register 34 with an enable function as shown in FIG. 3.

The input flag FI is input to the 1-bit counter 31a, the start circuit 32, and the register 34 with the enable function. Both the first operation clock CK1 and the reset signal RN are input to the 1-bit counters 31a and 31b, the start circuit 32, and the register 34 with the enable function.

When the reset signal RN at a low level is input for a certain period before the operation starts, the 1-bit counters 31a and 31b, the start circuit 32, and the register 34 with the enable function are reset. The 1-bit counters 31a and 31b, the start circuit 32, and the register 34 with the enable function output low-level signals respectively during a reset period.

When the reset signal RN rises to a high level, the control circuit 21 waits for the input flag FI to rise to a high level. When the input flag FI is at a low level at the time when the reset signal RN has risen, outputs of the 1-bit counters 31a and 31b, the start circuit 32 and the register 34 with the enable function does not change from the reset state until the input flag FI rises up to a high level.

The start circuit 32 outputs a high-level signal to the 1-bit counter 31b when the input flag FI is at a high level at the time when the reset signal RN rises up to a high level, or when the reset signal RN rises up to a high level and then the input flag FI is changed from a low level to a high level. Thereafter, the output of the start circuit 32 is kept at a high level regardless of the value of the input flag FI.

The 1-bit counter 31b starts a counting operation when a high-level signal is input from the start circuit 32. When the 1-bit counter 31b receives a high-level signal (that is, when the 1-bit counter 31b is started by the start circuit 32), the 1-bit counter 31b outputs the input sort signal IS whose level is inverted in synchronization with the rising edge of the first operation clock CK1. The input sort signal IS is input to the mismatch detection circuit 33. The input sort signal IS is input from the control circuit 21 to the multiplexers 22a and 22b as the first selection signal.

The 1-bit counter 31a outputs an output sort signal OS whose level is inverted in synchronization with the rising edge of the first operation clock CK1 to the mismatch detection circuit 33 when the input flag FI is at a high level. On the other hand, when the input flag FI is at a low level, the 1-bit counter 31a outputs the output sort signal OS to the mismatch detection circuit 33 without changing the level of the output sort signal OS.

Output sort signal OS output from the 1-bit counter 31a becomes a signal indicating a correct distribution destination of the input data DI input to the demultiplexer 15. The correct distribution destination of the input data DI is the first output data DO1 when the output sort signal OS is at a low level, and the second output data DO2 when the output sort signal OS is at a high level.

The mismatch detection circuit 33 detects whether the signal levels of the input sort signal IS and the output sort signal OS match or not. The mismatch detection circuit 33 outputs a low-level signal to the register 34 with the enable function when the signal levels of the input sort signal IS and the output sort signal OS match. On the other hand, the mismatch detection circuit 33 outputs a high-level signal to the register 34 with the enable function when the signal levels of the input sort signal IS and the output sort signal OS do not match.

When the input flag FI is at a low level, the register 34 with the enable function outputs the output exchange signal OX without changing the level of the output exchange signal OX. On the other hand, when the input flag FI is at a high level, the register 34 with the enable function fetches the output of the mismatch detection circuit 33 in synchronization with the rising edge of the first operation clock CK1 and outputs the output as the output exchange signal OX. The output exchange signal OX is input from the control circuit 21 to the multiplexers 22c and 22d as the second selection signal.

Figure 4:
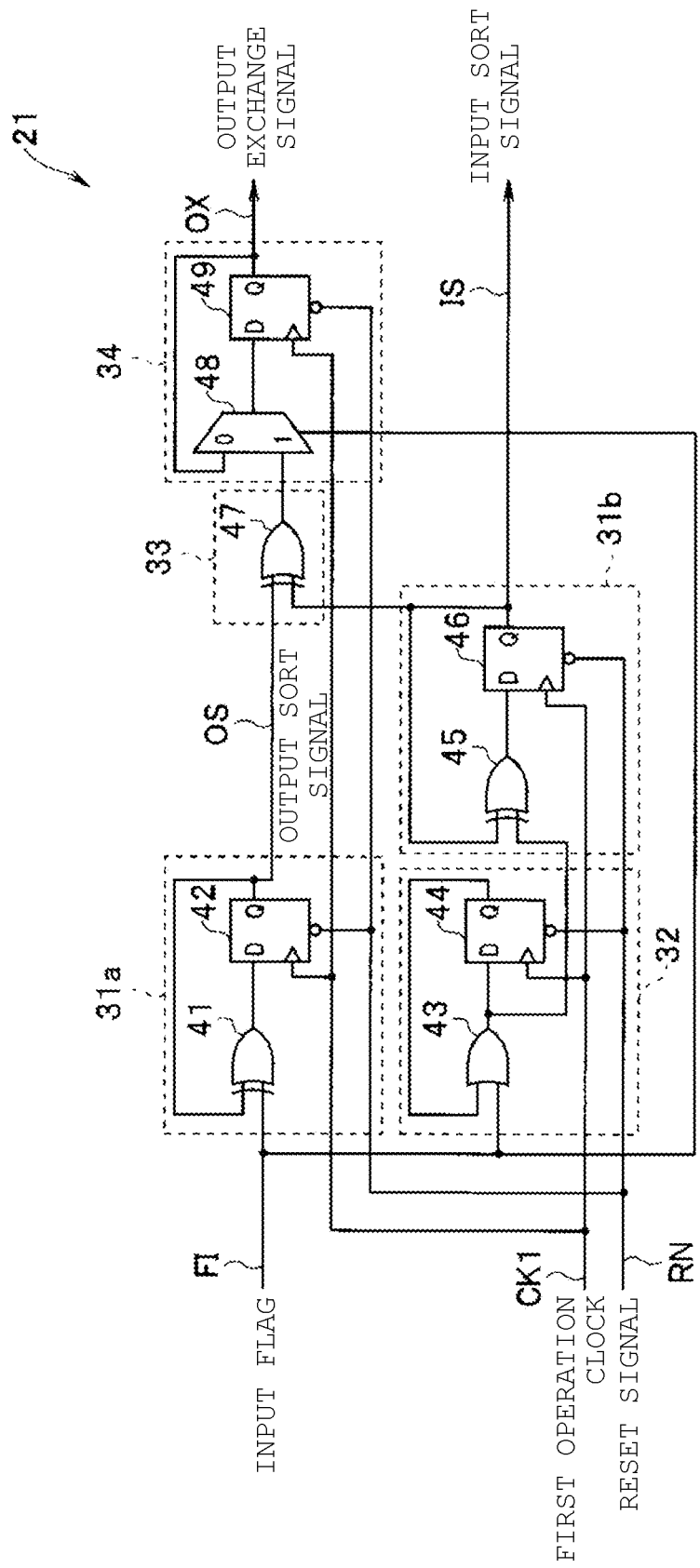
FIG. 4 is a circuit diagram showing an example of a configuration of the control circuit according to the first embodiment.

FIG. 4 is a circuit diagram showing an example of a configuration of the control circuit according to the first embodiment. FIG. 4 shows a detailed circuit configuration of the control circuit 21 as shown in FIG. 3. In the circuit configuration shown in FIG. 4, a part corresponding to each block in FIG. 3 is surrounded by a dashed line and the same reference character as each block in FIG. 3 is added.

The 1-bit counter 31a is configured with an XOR gate 41 and a flip-flop 42. The start circuit 32 is configured with an OR gate 43 and a flip-flop 44. The 1-bit counter 31b is configured with an XOR gate 45 and a flip-flop 46. The mismatch detection circuit 33 is configured with an XOR gate 47. The register 34 with the enable function is configured with a multiplexer 48 and a flip-flop 49.

The input flag FI is input to one input terminal of the XOR gate 41. The output sort signal OS fed back from the flip-flop 42 is input to the other input terminal of the XOR gate 41.

The XOR gate 41 calculates an exclusive OR between the input flag FI and the output sort signal OS, and outputs the arithmetic result to the flip-flop 42. Specifically, the XOR gate 41 outputs the output sort signal OS fed back from the flip-flop 42 to the flip-flop 42 without inverting the level of the output sort signal OS when the input flag FI is a low level, and outputs the output sort signal OS with inverting the level of the output sort signal OS to the flip-flop 42 when the input flag FI is a high level.

The flip-flop 42 fetches the output of the XOR gate 41 in synchronization with the rising edge of the first operation clock CK1 and outputs the output as the output sort signal OS. The output sort signal OS is fed back to the XOR gate 41 and input to one input terminal of the XOR gate 47. Thus, when the input flag FI is at a high level, the output sort signal OS whose level is inverted in synchronization with the rising edge of the first operation clock CK1 is output from the 1-bit counter 31a.

The input flag FI is input to one input terminal of the OR gate 43. An output signal of the flip-flop 44 is fed back and input to the other input terminal of the OR gate 43. The OR gate 43 performs an OR operation between the input flag FI and the signal fed back from the flip-flop 44, and outputs the arithmetic result to the flip-flop 44 and the XOR gate 45. The flip-flop 44 fetches the output of the OR gate 43 in synchronization with the rising edge of the first operation clock CK1 and feeds the output back to the other input terminal of the OR gate 43.

When the output of the flip-flop 44 is at a low level, the output of the OR gate 43 is at the same logic level as the input flag FI. The output of the OR gate 43 is at a high level when the output of the flip-flop 44 is at a high level. Therefore, when the input flag FI is at a high level after the reset signal RN has risen, the output of the flip-flop 44 is at a high level in synchronization with the rising edge of the first operation clock CK1. Since the output of the flip-flop 44 is fed back to the OR gate 43, the output of the OR gate 43 is always kept at a high level regardless of the value of the input flag FI when the input flag FI is at a high level after the reset signal RN has risen.

The output signal of the OR gate 43 is input to one input terminal of the XOR gate 45, and the input sort signal IS fed back from the flip-flop 46 is input to the other input terminal of the XOR gate 45.

The XOR gate 45 calculates an exclusive OR between the output signal of the OR gate 43 and the input sort signal IS fed back from the flip-flop 46, and outputs the arithmetic result to the flip-flop 46. The XOR gate 45 does not invert the level of the input sort signal IS when the output signal of the OR gate 43 is at a low level, and inverts the level of the input sort signal IS and outputs the inverted input sort signal IS to the flip-flop 46 when the output signal of the OR gate 43 is at a high level.

The flip-flop 46 fetches the output of the XOR gate 45 in synchronization with the rising edge of the first operation clock CK1 and outputs the output as the input sort signal IS. Thus, the input sort signal IS whose level is inverted in synchronization with the rising edge of the first operation clock CK1 is output from the 1-bit counter 31b.

The input sort signal IS is fed back to the other input terminal of the XOR gate 45 and input to the other input terminal of the XOR gate 47. The input sort signal IS is supplied to the multiplexers 22a and 22b as the first selection signal.

The XOR gate 47 calculates an exclusive OR between the input sort signal IS and the output sort signal OS, and outputs the arithmetic result to the multiplexer 48. The XOR gate 47 outputs a low-level output signal to the multiplexer 48 when the levels of the input sort signal IS and the output sort signal OS are equal, and outputs a high-level output signal to the multiplexer 48 when the levels of the input sort signal IS and the output sort signal OS are not equal.

The output signal of the XOR gate 47 is input to one input terminal of the multiplexer 48. The output exchange signal OX fed back from the flip-flop 49 is input to the other input terminal of the multiplexer 48. The input flag FI is input as a selection signal to a control terminal of the multiplexer 48.

When the input flag FI is at a low level, the multiplexer 48 selects the output exchange signal ox fed back from the flip-flop 49, and when the input flag FI is at a high level, the multiplexer 48 selects the output signal of the XOR gate 47. The multiplexer 48 outputs the selected signal to the flip-flop 49.

The flip-flop 49 fetches the output signal from the multiplexer 48 in synchronization with the rising edge of the first operation clock CK1 and outputs the output signal as the output exchange signal OX. Thus, the output exchange signal Ox changes to the same value as the output signal of the XOR gate 47 in synchronization with the rising edge of the first operation clock CK1 only when the input flag FI being the selection signal of the multiplexer 48 is at a high level. The output exchange signal OX is fed back to the other input terminal of the multiplexer 48. The output exchange signal OX is supplied to the multiplexers 22c and 22d as the second selection signal.

Next, the operation of the demultiplexer 15 configured in this manner is described.

Figure 5:
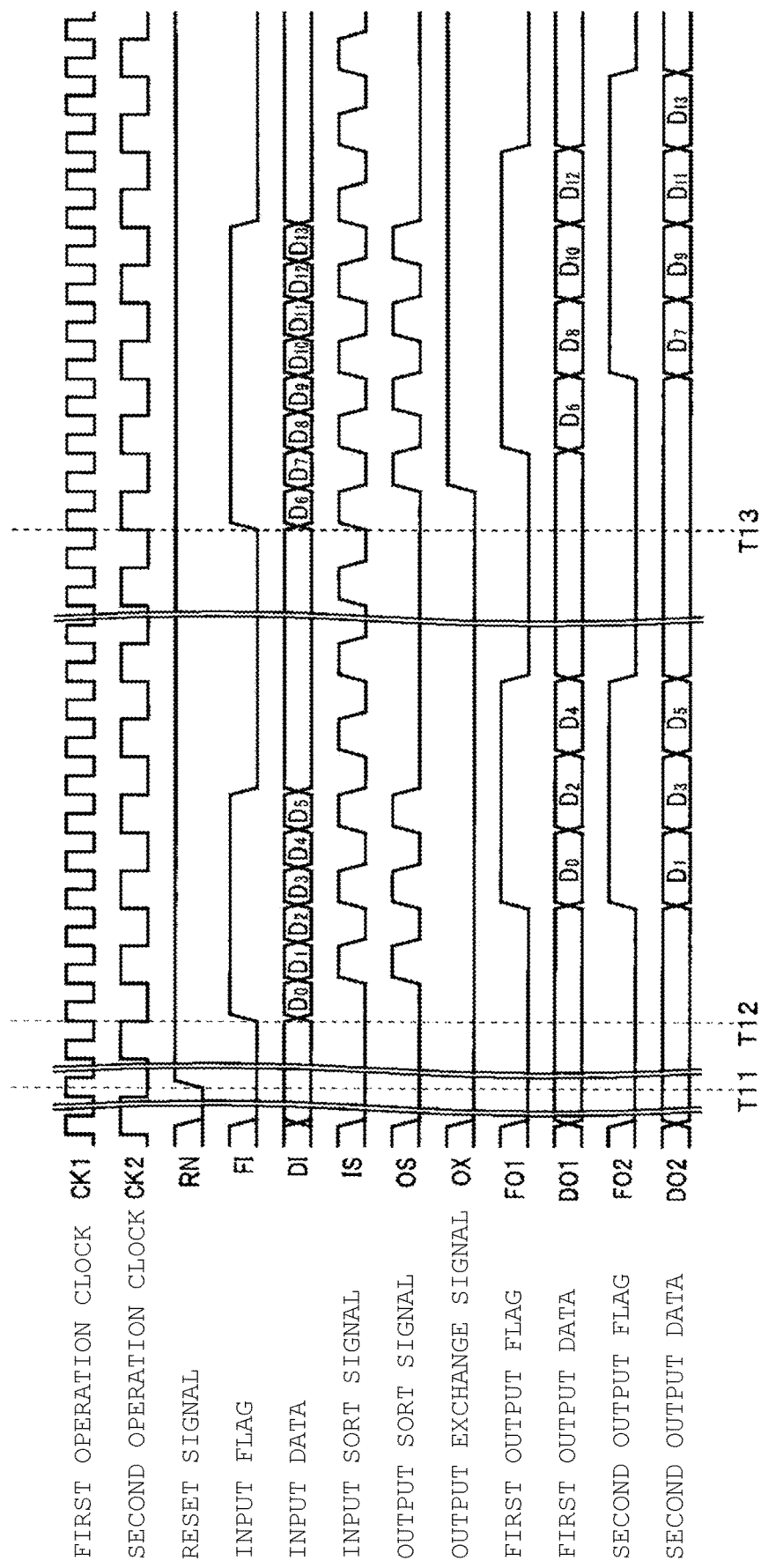
FIG. 5 is a timing chart illustrating an operation of the demultiplexer in the first embodiment.

FIG. 5 is a timing chart illustrating the operation of the demultiplexer in the first embodiment.

In FIG. 5, as valid input data DI, input data $D_0$ to $D_{13}$ is supplied to the demultiplexer 15. The demultiplexer 15 distributes the input data $D_0$ to $D_{13}$ to the first output data DO1 of the even numbered input data $D_0$, $D_2$, $D_4$, $D_6$, $D_8$, $D_{10}$, and $D_{12}$, and the second output data DO2 of the odd numbered input data $D_1$, $D_3$, $D_5$, $D_7$, $D_9$, $D_{11}$, and $D_{13}$.

After the reset signal RN rises from a low level to a high level at time T11, at time T12, the first input data $D_0$ is supplied at the same timing as the falling of the second operation clock CK2.

When the input flag FI rises from a low level to a high level after the reset signal RN rises from a low level to a high level, a high-level signal is output from the start circuit 32 to the 1-bit counter 31b. The start circuit 32 outputs a high-level signal to the 1-bit counter 31b until the reset signal RN falls down to a low level.

When a high-level signal is input from the start circuit 32, a 1-bit counter 31b outputs the input sort signal IS whose level is inverted in synchronization with the rising edge of the first operation clock CK1. Therefore, the input sort signal IS inverts the level in synchronization with the rising edge of the first operation clock CK1 until the reset signal RN falls down to a low level.

When the input flag FI rises from a low level to a high level after the reset signal RN rises from a low level to a high level, the 1-bit counter 31a outputs the output sort signal OS whose level is inverted in synchronization with the rising edge of the first operation clock CK1. The output sort signal OS inverts the level in synchronization with the rising edge of the first operation clock CK1 during a period in which the input flag FI is at a high level, and does not change the level during a period in which the input flag FI is at a low level.

The input data $D_0$ to $D_5$ is selected by the multiplexer 22a or 22b based on the input sort signal IS and input to the register 23a or 23b. When the input sort signal IS is at a low level, the input data DI is selected by the multiplexer 22a and is fetched into the register 23a. On the other hand, when the input sort signal IS is at a high level, the input data DI is selected by the multiplexer 22b and is fetched into the register 23b. That is, the input data $D_0$, $D_2$, and $D_4$ are selected by the multiplexer 22a and are fetched into the register 23a. The input data $D_1$, $D_3$, and $D_5$ are selected by the multiplexer 22b and are fetched into the register 23b.

Both input data fetched into the registers 23a and 23b are output to the multiplexers 22c and 22d. The multiplexer 22c selects the input data output from the register 23a or 23b based on the output exchange signal OX and outputs the selected input data to the register 23c. The multiplexer 22d selects the input data output from the register 23a or 23b based on the output exchange signal OX and outputs the selected input data to the register 23d.

When the signal levels of the input sort signal IS and the output sort signal OS are the same, a low-level signal is output from the mismatch detection circuit 33 to the register 34 with the enable function. When the input flag FI is at a high level, the register 34 with the enable function fetches the output of mismatch circuit 33 in the detection synchronization with the rising edge of the first operation clock CK1 and outputs the output as the output exchange signal OX. Therefore, a low-level signal is input to multiplexers 22c and 22d as the output exchange signal OX.

Thus, the input data $D_0$, $D_2$, and $D_4$ output from the register 23a are selected by the multiplexer 22c and are fetched into the register 23c. The input data $D_1$, $D_3$, and $D_5$ output from the register 23b are selected by the multiplexer 22d and fetched into the register 23d.

As a result, 6 pieces of the input data $D_0$ to $D_5$ are separated into even numbers and odd numbers, and are output as the first output data DO1 and the second output data DO2, respectively.

After the input data $D_5$ is input and a period in which the input data DI is invalid elapses, the input data $D_0$ is supplied at the same timing as the rising of the second operation clock CK2 at time T13. In this case, the input data $D_6$, $D_8$, $D_{10}$, and $D_{12}$ are supplied during a period in which the input sort signal IS is at a high level, and the input data $D_7$, $D_9$, $D_{11}$, and $D_{13}$ are supplied during a period in which the input sort signal IS is at a low level. Therefore, the even numbered input data $D_6$, $D_8$, $D_{10}$, and $D_{12}$ are selected by the multiplexer 22b and fetched into the register 23b, and the odd numbered input data $D_7$, $D_9$, $D_{11}$, and $D_{13}$ are selected by the multiplexer 22a and fetched into the register 23a.

When the input flag FI rises up to a high level at time T13, the output sort signal OS whose level is inverted in synchronization with the rising edge of the first operation clock CK1 is output from the 1-bit counter 31a. In this case, since the levels of the input sort signal IS and the output sort signal OS do not match, a high-level signal is output from the mismatch detection circuit 33 to the register 34 with the enable function. Thus, the output exchange signal OX that rises up to a high level in synchronization with the rising edge of the first operation clock CK1 is output from the register 34 with the enable function to the multiplexers 22c and 22d.

Thus, the even numbered input data $D_6$, $D_8$, $D_{10}$, and $D_{12}$ are selected by the multiplexer 22c and fetched into the register 23c, and the odd numbered input data $D_7$, $D_9$, $D_{11}$, and $D_{13}$ are selected by the multiplexer 22d and fetched into the register 23d.

As a result, 8 pieces of the input data $D_6$ to $D_{13}$ are separated into even numbers and odd numbers, and are output as the first output data DO1 and the second output data DO2, respectively.

Thus, the control circuit 21 determines whether output destinations (distribution destinations) of the registers 23a and 23b should be exchanged according to the states of the input sort signal IS and the output sort signal OS. When the control circuit 21 determines that the output destinations of the registers 23a and 23b should not be exchanged, the control circuit 21 outputs the low-level output exchange signal OX to the multiplexers 22c and 22d. On the other hand, when the control circuit 21 determines that the output destinations of the registers 23a and 23b should be exchanged, the control circuit 21 outputs the high-level output exchange signal OX to the multiplexers 22c and 22d.

By the above operation, the input data $D_0$ to $D_{13}$ (valid input data DI) are output with distributed to the first output data DO1 and the second output data DO2 in the arrival order during a period in which the input flag FI is at a high level. Even the input flag FI can be correctly distributed to the first output flag FO1 and the second output flag FO2 by being processed as an (n+1)-bit signal set with the input data DI.

Thus, even when the input flag FI is interrupted, the bridge chip 3 can control the separation operation while keeping the distribution order.

Figure 6:
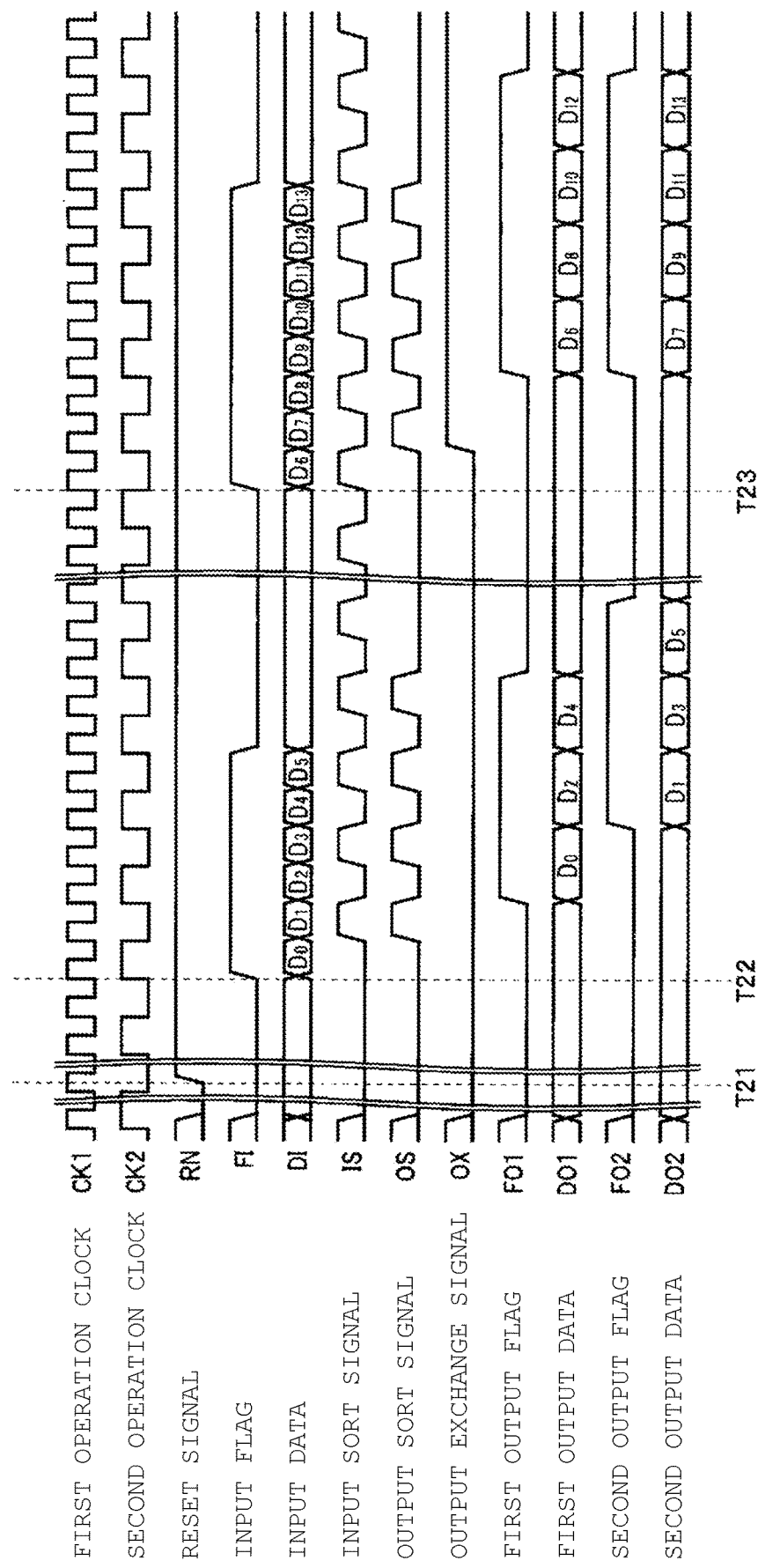
FIG. 6 is a timing chart illustrating the other operation of the demultiplexer in the first embodiment.

The FIG. 6 is a timing chart illustrating the other operation of the demultiplexer in the first embodiment.

In the timing chart in FIG. 5, the input data $D_0$ is supplied at the same timing as the falling of the second operation clock CK2, and the input data $D_6$ is supplied at the same timing as the rising of the second operation clock CK2.

In the timing chart in FIG. 6, the input data $D_0$ is supplied at the same timing as the rising of the second operation clock CK2, and the input data $D_0$ is supplied at the same timing as the falling of the second operation clock CK2.

Specifically, after the reset signal RN rises from a low level to a high level at time T21, the first input data $D_0$ is supplied at the same timing as the rising of the second operation clock CK2 at time T22. After the data $D_5$ is input and a period in which the input data DI is invalid elapses, the input data $D_0$ is supplied at the same timing as the falling of the second operation clock CK2 at time T23.

When the input flag FI is at a high level and the signal levels of the input sort signal IS and the output sort signal OS do not match at time T23, the output exchange signal OX rises up to a high level in synchronization with the rising edge of the first operation clock CK1. Thus, the output destination of the input data DI is exchanged in the multiplexers 22c and 22d and the data is output to a correct output destination.

As a result, the input data $D_0$ to $D_{13}$ are separated into even numbers and odd numbers, and output as the first output data DO1 and the second output data DO2, respectively.

Figure 7:
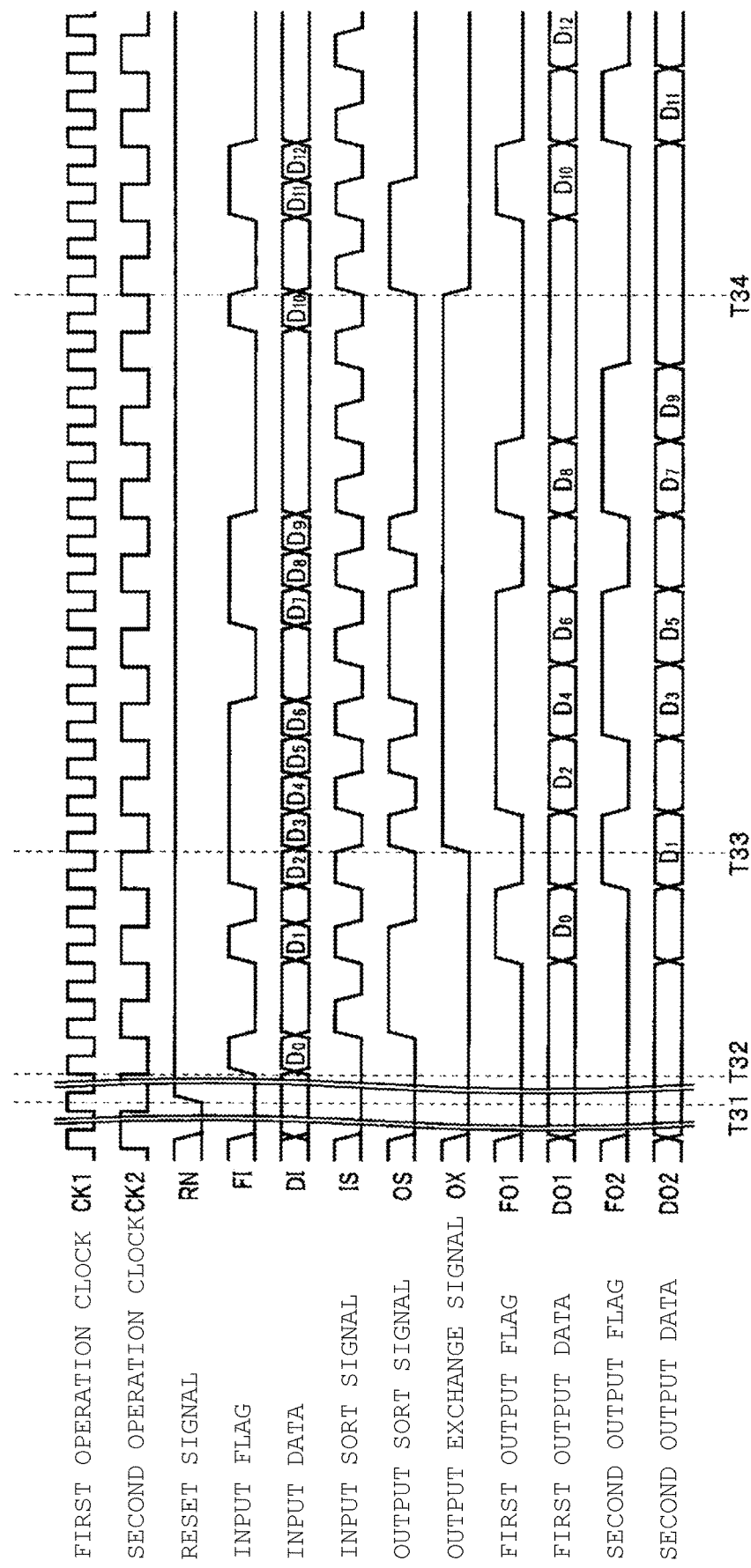
FIG. 7 is a timing chart illustrating further another operation of the demultiplexer in the first embodiment.

FIG. 7 is a timing chart illustrating further another operation of the demultiplexer in the first embodiment.

After the reset signal RN rises from a low level to a high level at time T31, at time T32, the first input data $D_0$ is supplied at the same timing as the falling of the second operation clock CK2. Then, the input flag FI and the input data DI are input in a random period.

Even when the input flag FI and the input data DI are input in the random period, when the input flag FI is at a high level and the signal levels of the input sort signal IS and the output sort signal OS do not match at time T33, the output exchange signal OX rises up to a high level in synchronization with the rising edge of the first operation clock CK1. When the input flag FI is at a high level and the signal levels of the input sort signal IS and the output sort signal OS match at time T34, the output exchange signal OX falls down to a low level in synchronization with the rising edge of the first operation clock CK1.

As a result, the input data $D_0$ to $D_{13}$ are separated into even numbers and odd numbers, and output as the first output data DO1 and the second output data DO2, respectively.

Figure 8:
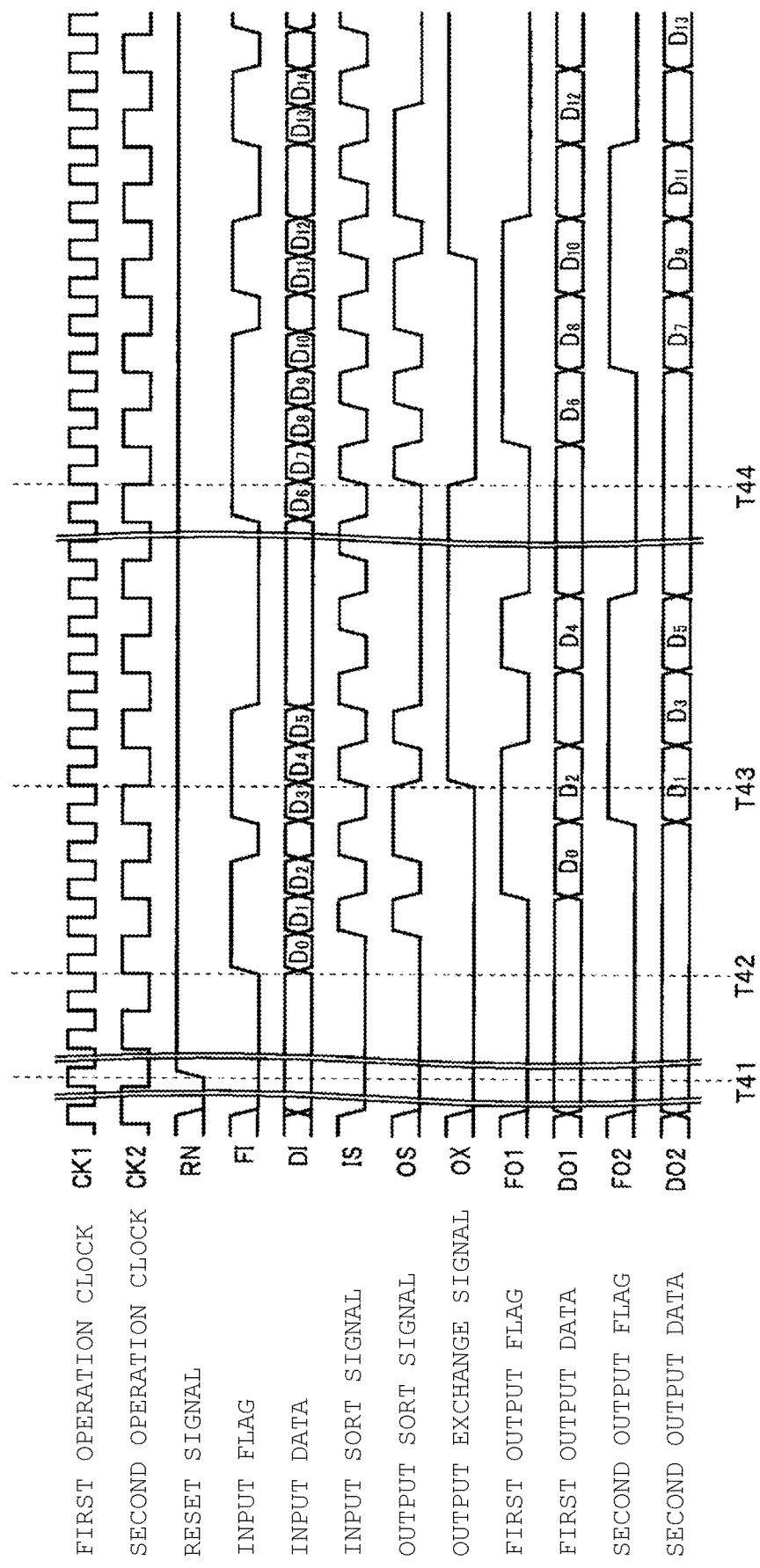
FIG. 8 is a timing chart illustrating still another operation of the demultiplexer in the first embodiment.

FIG. 8 is a timing chart illustrating still another operation of the demultiplexer in the first embodiment.

In the timing chart in FIG. 7, the data $D_0$ is supplied at the same timing as the falling of the second operation clock CK2.

In the timing chart in FIG. 8, the data $D_0$ is supplied at the same timing as the rising of the second operation clock CK2.

Specifically, after the reset signal RN rises from a low level to a high level at time T41, the first input data $D_0$ is supplied at the same timing as the rising of the second operation clock CK2 at time T42. Then, the input flag FI and the input data DI are input in a random period.

Even when the input flag FI and the input data DI are input in the random period, when the input flag FI is at a high level and the signal levels of the input sort signal IS and the output sort signal OS do not match at time T43, the output exchange signal OX rises up to a high level in synchronization with the rising edge of the first operation clock CK1. When the input flag FI is at a high level and the signal levels of the input sort signal IS and the output sort signal OS match at time T44, the output exchange signal OX falls down to a low level in synchronization with the rising edge of the first operation clock CK1.

As a result, the input data $D_0$ to $D_{13}$ are separated into even numbers and odd numbers, and output as the first output data DO1 and the second output data DO2, respectively.

Modification Example

Figure 9:
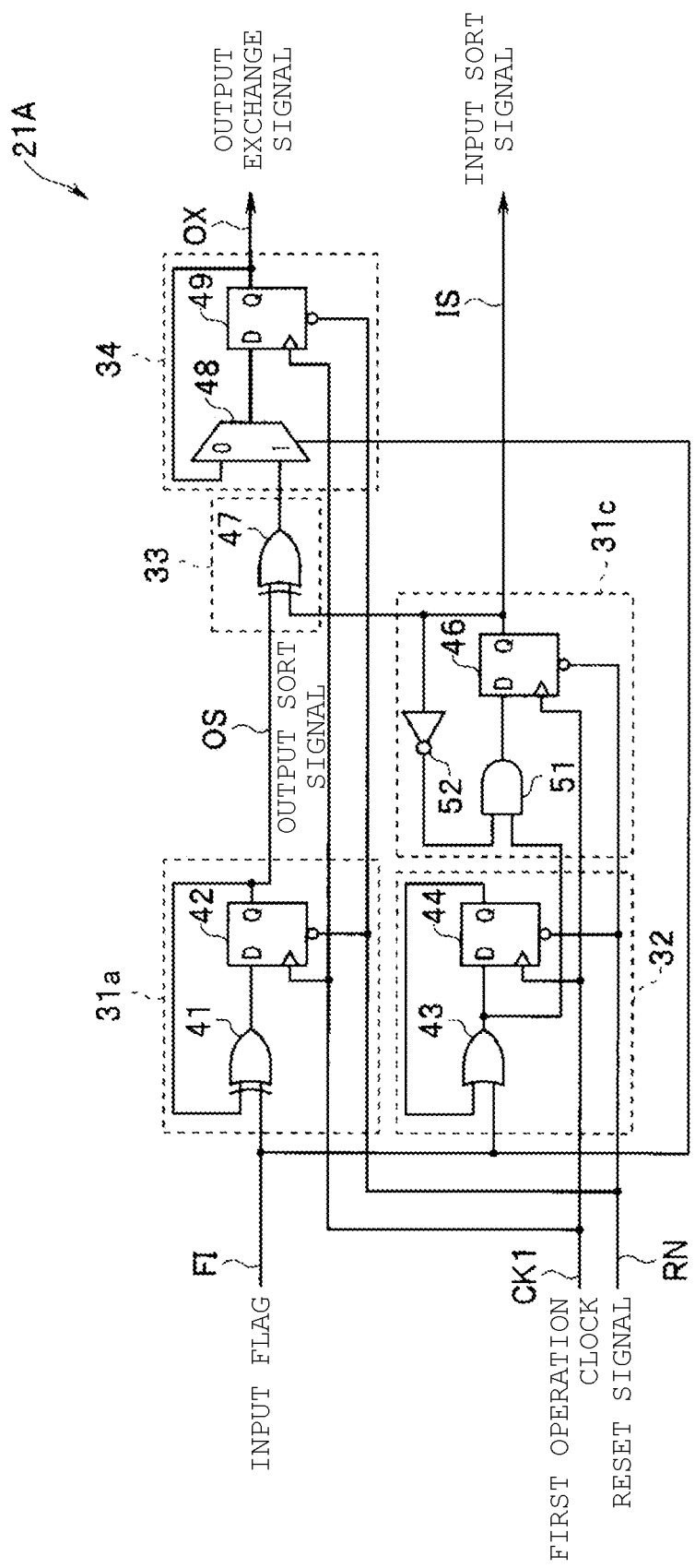
FIG. 9 is a circuit diagram showing an example of a configuration of a control circuit according to a modification example.

FIG. 9 is a circuit diagram showing an example of a configuration of a control circuit according to a modification example. In FIG. 9, the same reference character is added to the same configuration as that of FIG. 4 and the description is omitted.

As shown in FIG. 9, a control circuit 21A is implemented by a 1-bit counter 31c instead of the 1-bit counter 31b of the control circuit 21 shown in FIG. 4. The 1-bit counter 31c includes an AND gate 51, an inverter 52, and the flip-flop 46. That is, in the 1-bit counter 31c, the XOR gate 45 of the 1-bit counter 31b is replaced with a combination of the AND gate 51 and the inverter 52.

The output signal of the OR gate 43 is input to one input terminal of the AND gate 51. An output signal of the inverter 52 is input to the other input terminal of the AND gate 51. The AND gate 51 performs an AND operation of the output signal of the OR gate 43 and the output signal of the inverter 52, and outputs the arithmetic result to the flip-flop 46.

The flip-flop 46 fetches the output signal of the AND gate 51 in synchronization with the rising edge of the first operation clock CK1 and outputs the fetched output signal as the input sort signal IS. The inverter 52 inverts the level of the input sort signal IS output from the flip-flop 46 and outputs the input sort signal IS whose level is inverted to the AND gate 51.

With such a configuration, when the output of the OR gate 43 is at a low level, the AND gate 51 outputs a low level, and when the output of the OR gate 43 is at a high level, the same logic level as the output of the inverter 52 is output to the flip-flop 46. The output of the inverter 52 is a value obtained by inverting the level of the input sort signal IS which is an output of the flip-flop 46.

Therefore, since the 1-bit counter 31c outputs a low level until started by the start circuit 32, that is, until the output of the OR gate 43 becomes at a high level, the counting operation is stopped. After being started by the start circuit 32, that is, after the output of the OR gate 43 becomes at a high level, the 1-bit counter 31c performs a counting operation in which the logical level is inverted in synchronization with the rising edge of the first operation clock CK1.

Thus, the 1-bit counter 31c outputs the input sort signal IS whose level is inverted in synchronization with the rising edge of the first operation clock CK1 when started by the start circuit 32, in the same way as the 1-bit counter 31b shown in FIG. 4. Therefore, the operation of the control circuit 21A does not change from the operation before replacing the 1-bit counter 31b with the 1-bit counter 31c.

Generally, the combination of the AND gate 51 and the inverter 52 has fewer transistors included in the circuit than the XOR gate 45. Therefore, the 1-bit counter 31c can reduce the circuit area and the power consumption more than the 1-bit counter 31b.

The 1-bit counter 31c uses the combination of the AND gate 51 and the inverter 52 instead of the XOR gate 45 in FIG. 4, but is not limited to such a configuration. For example, the combination of the NOR gate and the inverter may be used instead of the combination of the AND gate 51 and the inverter 52. By replacing the AND gate 51 and the inverter 52 with the combination of the NOR gate and the inverter, the number of transistors included in the circuit can be further reduced, and the circuit area and power consumption can be further reduced than the 1-bit counter 31c.

Second Embodiment

Next, a second embodiment is described.

Figure 10:
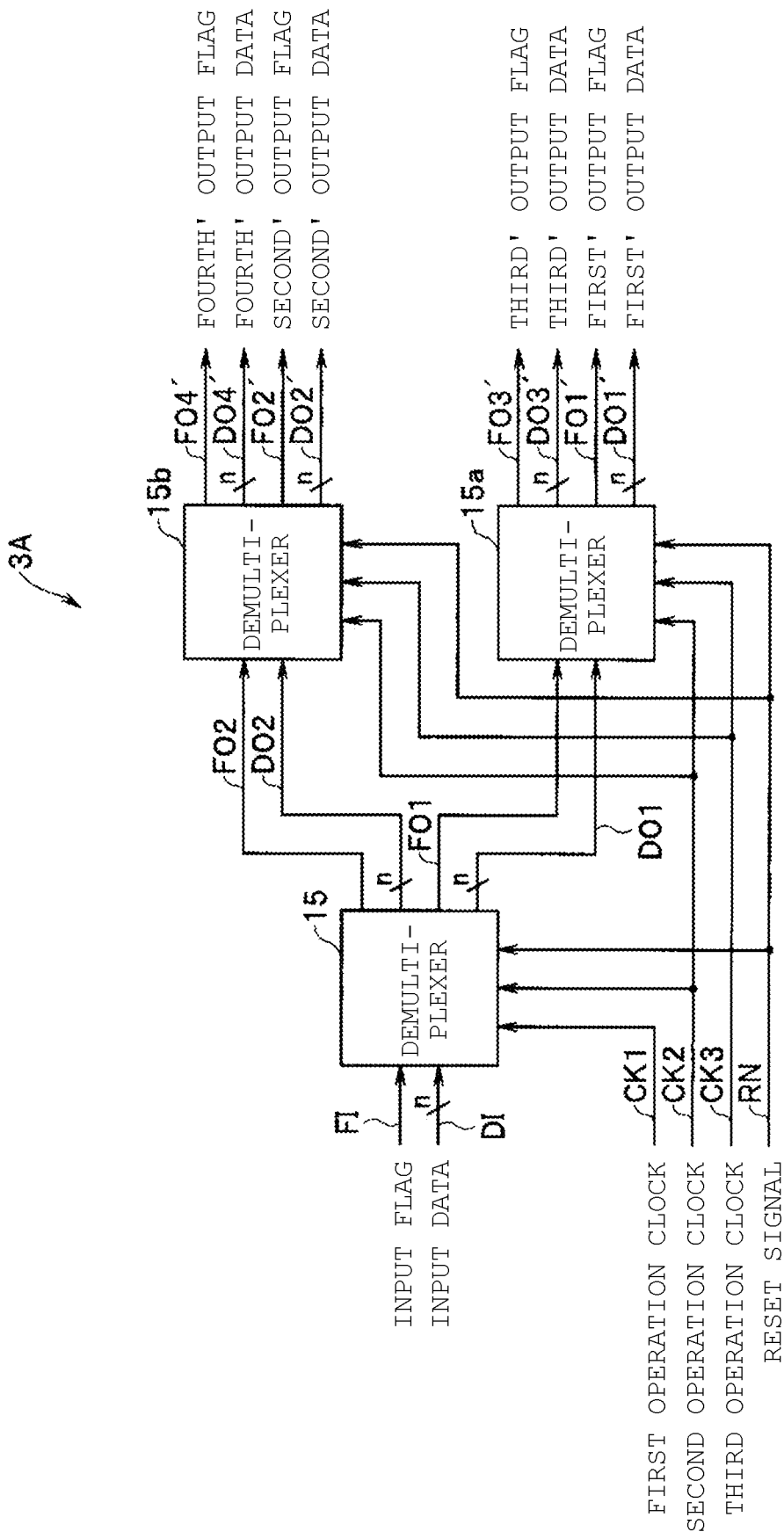
FIG. 10 is a block diagram showing a configuration of a bridge chip according to a second embodiment.

FIG. 10 is a block diagram showing a configuration of a bridge chip according to the second embodiment. In FIG. 10, the same reference character is added to the same configuration as that of FIG. 1. A bridge chip 3A shown in FIG. 10 shows only the connection configuration of a demultiplexer in the bridge chip 3A.

As shown in FIG. 10, the bridge chip 3A includes demultiplexers 15a and 15b in addition to the demultiplexer 15.

The demultiplexers 15, 15a, and 15b are connected in a binary tree shape. Specifically, the demultiplexers 15a and 15b are connected to the output stage of the demultiplexer 15.

The first output flag FO1 and the first output data DO1 output from the demultiplexer 15 are input to the demultiplexer 15a, and the second output flag FO2 and the second output data DO2 are input to the demultiplexer 15b.

By such a configuration, the demultiplexers 15, 15a, and 15b distributes the input flag FI and the input data DI to first' output flags FO1' to fourth' output flags FO4' and first' output data DO1' to fourth' output data DO4', respectively. The demultiplexers 15a and 15b are configured the same as the demultiplexer 15 shown in FIGS. 2 to 4.

The clock generator 11 generates a third operation clock CK3 in addition to the first operation clock CK1 and the second operation clock CK2. The third operation clock CK3 is a clock obtained by dividing the second operation clock CK2 by two.

The first operation clock CK1, the second operation clock CK2 and the reset signal RN are input to the demultiplexer 15. The second operation clock CK2, the third operation clock CK3, and the reset signal RN are input to the demultiplexers 15a and 15b.

The demultiplexer 15 separates the input flag FI and the input data DI into the first output flag FO1, the first output data DO1, the second output flag FO2, and the second output data DO2 based on the first operation clock CK1, the second operation clock CK2, and the reset signal RN. The demultiplexer 15 outputs the separated first output flag FO1 and first output data DO1 to the demultiplexer 15a, and outputs the separated second output flag FO2 and second output data DO2 to the demultiplexer 15b.

The demultiplexer 15a separates the first output flag FO1 and the first output data DO1 into the first' output flag FO1', the first' output data DO1', the third' output flag FO3', and the third' output data DO3' based on the second operation clock CK2, the third operation clock CK3, and the reset signal RN.

The demultiplexer 15b separates the second output flag FO2 and the second output data DO2 into the second' output flag FO2', the second' output data DO2', the fourth' output flag FO4', and the fourth' output data DO4' based on the second operation clock CK2, the third operation clock CK3, and the reset signal RN.

In the demultiplexers 15a and 15b, the second operation clock CK2 and the third operation clock CK3 perform the same functions as the first operation clock CK1 and the second operation clock CK2 in the demultiplexer 15.

With such a configuration, when the semiconductor storage device 2 includes 4 memory chips, for example, the bridge chip 3A separates the input flag FI and the input data DI into the first' output flag FO1' to the fourth' output flag FO4' and the first' output data DO1' to the fourth' output data DO4', and can transmit the separated flags and data to the 4 memory chips.

Third Embodiment

Next, a third embodiment is described.

Figure 11:
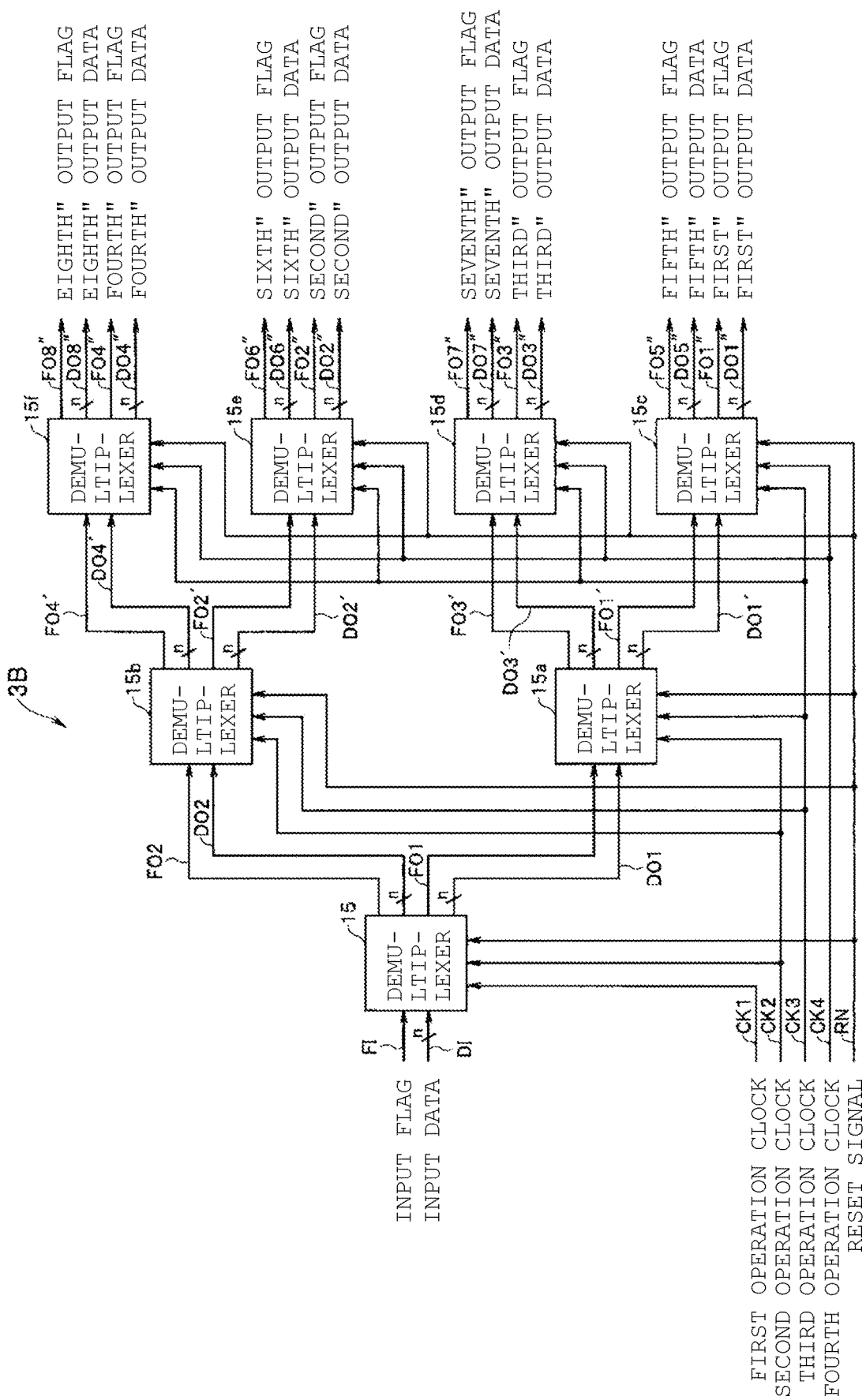
FIG. 11 is a block diagram showing a configuration of a bridge chip according to a third embodiment.

FIG. 11 is a block diagram showing a configuration of a bridge chip according to the third embodiment. In FIG. 11, the same reference character is added to the same configuration as that of FIG. 10 and the description is omitted. A bridge chip 3B shown in FIG. 11 shows only the connection configuration of the demultiplexer in the bridge chip 3B.

As shown in FIG. 11, the bridge chip 3B includes demultiplexers 15c to 15f in addition to the demultiplexers 15, 15a, and 15b. The demultiplexers 15 and 15a to 15f are connected in a binary tree shape. Specifically, the demultiplexers 15a and 15b are connected to the output stage of the demultiplexer 15. The demultiplexers 15c and 15d are connected to the output stage of the demultiplexer 15a. Further, the demultiplexers 15e and 15f are connected to the output stage of the demultiplexer 15b.

The first' output flag FO1' and the first' output data DO1' output from the demultiplexer 15a are input to the demultiplexer 15c, and the third' output flag FO3' and the third' output data DO3' are input to the demultiplexer 15d. The second' output flag FO2' and the second' output data DO2' output from the demultiplexer 15b are input to the demultiplexer 15e, and the fourth' output flag FO4' and the fourth' output data DO4' are input to the demultiplexer 15f.

With such a configuration, the demultiplexer 15, and 15a to 15f distribute the input flag FI and the input data DI to a first" output flag FO1" to an eighth" output flag FO8" and first" output data DO1" to eighth" output data DO8", respectively. Each configuration of the demultiplexers 15c to 15f is the same as that of the demultiplexer 15 shown in FIGS. 2 to 4.

The clock generator 11 generates a fourth operation clock CK4 in addition to the first operation clock CK1, the second operation clock CK2, and the third operation clock CK3. The fourth operation clock CK4 is a clock obtained by dividing the third operation clock CK3 by two.

The third operation clock CK3, the fourth operation clock CK4 and the reset signal RN are input to the demultiplexers 15c to 15f.

The first' output flag FO1' and the first' output data DO1' are input to the demultiplexer 15c from the demultiplexer 15a. The demultiplexer 15c separates the first' output flag FO1' and the first' output data DO1' into the first" output flag FO1", the first" output data DO1", the fifth" output flag FO5", and the fifth" output data DO5" based on the third operation clock CK3, the fourth operation clock CK4, and the reset signal RN.

The third' output flag FO3' and the third' output data DO3' are input to the demultiplexer 15d from the demultiplexer 15a. The demultiplexer 15d separates the third' output flag FO3' and the third' output data DO3' into the third" output flag FO3", the third" output data DO3", the seventh" output flag FO7", and the seventh" output data DO7" based on the third operation clock CK3, the fourth operation clock CK4, and the reset signal RN.

The second' output flag FO2' and the second' output data DO2' are input to the demultiplexer 15e from the demultiplexer 15b. The demultiplexer 15e separates the second' output flag FO2' and the second' output data DO2' into the second" output flag FO2", the second" output data DO2", the sixth" output flag FO6", and the sixth" output data DO6" based on the third operation clock CK3, the fourth operation clock CK4, and the reset signal RN.

The fourth' output flag FO4' and the fourth' output data DO4' are input to the multiplexer 15f from the demultiplexer 15b. The demultiplexer 15f separates the fourth' output flag FO4' and the fourth' output data DO4' into the fourth" output flag FO4", the fourth" output data DO4", the eighth" output flag FO8", and the eighth" output data DO8" based on the third operation clock CK3, the fourth operation clock CK4, and the reset signal RN.

In the demultiplexers 15c to 15f, the third operation clock CK3 and the fourth operation clock CK4 perform the same functions as the first operation clock CK1 and the second operation clock CK2 in the demultiplexer 15.

With such a configuration, when the semiconductor storage device 2 includes 8 memory chips, for example, the bridge chip 3B can separate the input flag FI and the input data DI into the first" output flag FO1" to the eighth" output flag FO8" and the first" output data DO1" to the eighth" output data DO8", and can transmit the separated flags and data to the 8 memory chips.

While certain embodiments have been described, these embodiments have been presented by way of example only, and are not intended to limit the scope of the disclosure. Indeed, the novel embodiments described herein may be embodied in a variety of forms; other furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A bridge chip comprising:
   a first selection circuit configured to determine a first output destination of input data and an input flag, the input flag indicating whether the input data is valid or invalid, based on a first selection signal;
   a second selection circuit configured to determine a second output destination of the input data and the input flag output from the first selection circuit, based on a second selection signal; and
   a control circuit configured to:
      generate the first selection signal and the second selection signal, and
      output the first selection signal and the second selection signal to the first selection circuit and the second selection circuit, respectively.

2. The bridge chip according to claim 1, further comprising:
   a first register configured to fetch an output of the first selection circuit in synchronization with a rising edge of a first operation clock; and
   a second register configured to fetch an output of the second selection circuit in synchronization with a rising edge of a second operation clock, the second operation clock being obtained by dividing the first operation clock by two.

3. The bridge chip according to claim 2, wherein the control circuit includes:
   a start circuit configured to start when the input flag rises up to a high level at a reset release point or after reset release, and
   a first counter configured to output the first selection signal whose level is inverted in synchronization with the rising edge of the first operation clock when the start circuit starts.

4. The bridge chip according to claim 3, wherein the control circuit further includes:
   a second counter configured to output an output signal whose level is inverted in synchronization with the rising edge of the first operation clock when the input flag is at a high level,
   a mismatch detection circuit configured to detect whether signal levels of the output signal and the first selection signal match, and
   a second register configured to fetch a detection result of the mismatch detection circuit in synchronization with the rising edge of the first operation clock, and output the detection result as the second selection signal.

5. The bridge chip according to claim 2, wherein the first register and the second register include flip flops.

6. The bridge chip according to claim 1, wherein the first and second selection circuits include multiplexers.

7. The bridge chip according to claim 1, further comprising:
   an interface circuit configured to receive a signal based on an output signal of the second selection circuit, and output data based on the received signal to at least one semiconductor device.

8. The bridge chip according to claim 7, wherein the at least one semiconductor device includes a NAND type flash memory.

9. A semiconductor storage device comprising:
   a bridge chip including:
      a first selection circuit configured to determine a first output destination of input data and an input flag, the input flag indicating whether the input data is valid or invalid, based on a first selection signal,
      a second selection circuit configured to determine a second output destination of the input data and the input flag output from the first selection circuit, based on a second selection signal, and
      a control circuit configured to:
         generate the first selection signal and the second selection signal, and
         output the first selection signal and the second selection signal to the first selection circuit and the second selection circuit, respectively; and
   a plurality of memory chips that are connected to the bridge chip.

10. The semiconductor storage device according to claim 9, wherein
   the bridge chip further includes:
      a first register configured to fetch an output of the first selection circuit in synchronization with a rising edge of a first operation clock; and
      a second register configured to fetch an output of the second selection circuit in synchronization with a rising edge of a second operation clock, the second operation clock being obtained by dividing the first operation clock by two.

11. The semiconductor storage device according to claim 10, wherein
   the control circuit includes:
      a start circuit configured to start when the input flag rises up to a high level at a reset release point or after reset release, and
      a first counter configured to output the first selection signal whose level is inverted in synchronization with the rising edge of the first operation clock when the start circuit start.

12. The semiconductor storage device according to claim 11, wherein
   the control circuit further includes:
      a second counter configured to output an output signal whose level is inverted in synchronization with the rising edge of the first operation clock when the input flag is at a high level,
      a mismatch detection circuit configured to detect whether signal levels of the output signal and the first selection signal match, and
      a second register configured to fetch a detection result of the mismatch detection circuit in synchronization with the rising edge of the first operation clock, and output the detection result as the second selection signal.

13. The semiconductor storage device according to claim 10, wherein the first register and the second register include flip flops.

14. The semiconductor storage device according to claim 9, wherein the first and second selection circuits include multiplexers.

15. The semiconductor storage device according to claim 9, wherein
the bridge chip further includes:
an interface circuit configured to receive a signal based on an output signal of the second selection circuit, and output data based on the received signal to at least one of memory chips.

16. The semiconductor storage device according to claim 15, wherein the plurality of memory chips includes a NAND type flash memory chip.

17. A memory system comprising:
the semiconductor storage device according to claim 9; and
a controller electrically connecting to the semiconductor storage device and configured to control writing of data into the plurality of memory chips.

18. The memory system according to claim 17, wherein the bridge chip further includes:
a first register configured to fetch an output of the first selection circuit in synchronization with a rising edge of a first operation clock; and
a second register configured to fetch an output of the second selection circuit in synchronization with a rising edge of a second operation clock, the second operation clock being obtained by dividing the first operation clock by two.

19. The memory system according to claim 17, wherein the bridge chip further includes:
an interface circuit configured to receive a signal based on an output signal of the second selection circuit, and output data based on the received signal to at least one of memory chips.

20. The memory system according to claim 19, wherein the plurality of memory chips includes a NAND type flash memory chip.

* * * * *